US005752182A

United States Patent [19]
Nakatsuka et al.

[11] Patent Number: 5,752,182
[45] Date of Patent: May 12, 1998

[54] HYBRID IC

[75] Inventors: Tadayoshi Nakatsuka, Toyonaka; Junji Itoh; Shinji Yamamoto, both of Hirakata; Mitsuru Nishitsuji, Neyagawa, all of Japan

[73] Assignee: Matsushita Electric Industrial Co., Ltd., Kadoma, Japan

[21] Appl. No.: 433,926

[22] Filed: May 2, 1995

[30] Foreign Application Priority Data

May 9, 1994 [JP] Japan ................... 6-094868

[51] Int. Cl.⁶ ................................. H04B 1/28
[52] U.S. Cl. ................ 455/333; 455/127; 455/128; 333/247
[58] Field of Search ............... 257/778, 7; 333/247, 333/128; 330/286, 295; 455/333, 127, 128; 361/777–779

[56] References Cited

U.S. PATENT DOCUMENTS

| | | | |
|---|---|---|---|
| 4,522,449 | 6/1985 | Hayward | 361/407 |
| 5,105,171 | 4/1992 | Wen et al. | 333/116 |
| 5,105,172 | 4/1992 | Khatibzadeh et al. | 333/175 |
| 5,448,197 | 9/1995 | Sagawa et al. | 327/408 |
| 5,528,203 | 6/1996 | Mohwinkel et al. | 333/128 |

FOREIGN PATENT DOCUMENTS 5251629  9/1993  Japan.

*Primary Examiner*—Reinhard J. Eisenzopf
*Assistant Examiner*—Darnell R. Armstrong
*Attorney, Agent, or Firm*—Renner, Otto, Boisselle & Sklar, P.L.L.

[57] ABSTRACT

On a ceramic substrate, spiral-type inductors of a single layer wiring of a metal thin film are provided and respectively connected to a wiring pattern formed on another face of the substrate via through holes. A semiconductor chip is flip-chip mounted on the substrate in a face-down manner. On the face of the semiconductor chip, capacitors composed of a highly dielectric material, resistors formed by an ion implantation method or a thin-film forming method, and FETs are provided, respectively. Interconnection between the substrate and an external circuit board is achieved employing terminals formed at end faces of the substrate. The terminals have a concave shape with respect to the end face of the substrate. Thus, there is no need to use a package, and miniaturization and reduction in cost of a high-performance hybrid IC is achieved.

37 Claims, 14 Drawing Sheets

HYBRID IC

BACKGROUND OF THE INVENTION

1. Field of the Invention

The present invention relates to a compact and high-performance hybrid IC for high-frequency uses (hereinafter referred to as a "high-frequency hybrid IC").

2. Description of the Related Art

With the rapid expansion or prevalence of mobile equipment, the mobile equipment has been required to be further miniaturized and to have even lighter weight, as has always been desired. Miniaturization is becoming mandatory even in high-frequency circuit portions which have conventionally been difficult to be highly integrated.

Hereinafter, a conventional example of high-frequency hybrid IC will be described with reference to the drawings.

FIG. 1 illustrates a conventional hybrid IC 10 disclosed in Japanese Laid-Open Patent Publication No. 5-251629. With reference to FIG. 1, field effect transistors (hereinafter referred to as "FETs"), resistors and capacitors are formed on a face (not shown) of a semiconductor chip 1. The semiconductor chip 1 is mounted in a face-down manner on pads provided on a front face of a ceramic substrate 4 via flip-chip bondings 2. Spiral-type inductors 3 are further formed on the front face of the ceramic substrate 4 by a printing technique.

Next, the ceramic substrate 4, on which the semiconductor chip 1 is mounted, is mounted on a package 8, and bonding pads 6 on the ceramic substrate 4 are connected to bonding pads 7 of the package 8 via bonding wires 5 made from, e.g., Au. Finally, the entire hybrid IC 10 is coated with resin (not shown in FIG. 1), thereby protecting its surface.

The package 8 has package pins 9, which are connected to the respective bonding pads 7. As a result of this, the circuit elements of the semiconductor chip 1 are connected to external circuitry via the package pins 9.

However, the conventional hybrid IC 10 requires a wire bonding process for interconnecting the ceramic substrate 4 and the package 8. As a result, the number of steps required for the production of the hybrid IC 10 increases, thereby increasing the production cost thereof. Moreover, the operation characteristics of the hybrid IC 10 may be unfavorably affected by a high-frequency signal being transmitted through the bonding wires 5 and the package pins 9. Furthermore, since capacitors internalized in the semiconductor chip 1 increase in size, the size of the semiconductor chip 1 may increase, thereby hindering the reduction of the production cost and miniaturization of the semiconductor chip 1.

SUMMARY OF THE INVENTION

A hybrid IC of the invention includes: a substrate; at least one inductor formed on the substrate; a semiconductor chip mounted on the substrate by flip-chip bonding; at least one terminal formed in a predetermined portion of an outer periphery of the substrate, wherein the semiconductor chip includes a plurality of circuit elements provided therein, at least one of the plurality of circuit elements being an MIM capacitor having a metal-insulation film-metal (MIM) structure, the insulation film being composed of a highly dielectric material.

In one embodiment of the invention, the hybrid IC further includes at least one matching circuit for matching an input signal to the circuit elements provided inside the semiconductor chip, the matching circuit including at least one inductor.

In another embodiment of the invention, a wiring pattern is formed of a single metal layer on both faces of the substrate, the wiring patterns on the respective faces of the substrate being interconnected with each other via through holes, and the at least one inductor included in the matching circuit is formed in the wiring pattern on one of the respective faces of the substrate.

In still another embodiment of the invention, the matching circuit is constituted only by inductors and includes at least one serial inductor and at least one parallel inductor. Preferably, the parallel inductor included in the matching circuit is a spiral-type inductor, outermost wiring of the spiral-type inductor being grounded.

In still another embodiment of the invention, the inductors included in the matching circuit are a spiral-type inductor or a meander-type inductor.

In still another embodiment of the invention, the matching circuit includes an inductor and a capacitor, the capacitor being formed inside the semiconductor chip. Preferably, the inductor included in the matching circuit is a spiral-type inductor or a meander-type inductor.

In still another embodiment of the invention, the at least one terminal includes at least an RF terminal functioning as an input terminal for an RF signal, an LO terminal functioning as an input terminal for an LO signal, an IF terminal functioning as an output terminal for an IF signal, a ground terminal, and a supply terminal.

In still another embodiment of the invention, any of the at least one terminal that adjoins the RF terminal, the LO terminal, and the IF terminal is the ground terminal or the supply terminal.

In still another embodiment of the invention, the semiconductor chip includes: an RF amplifier for amplifying the RF signal input at the RF terminal; an LO amplifier for amplifying the LO signal input at the LO terminal; and a mixer for generating the IF signal based on the amplified RF signal and the amplified LO signal.

In still another embodiment of the invention, the hybrid IC further includes: an RF input matching circuit, connected between the RF terminal and the RF amplifier, for matching the RF signal to the RF amplifier; and an LO input matching circuit, connected between the LO terminal and the LO amplifier, for matching the LO signal to the LO amplifier, wherein each of the RF input matching circuit and the LO input matching circuit includes at least one inductor.

In still another embodiment of the invention, a wire width of the at least one inductor included in the RF input matching circuit is larger than a wire width of the at least one inductor included in the LO input matching circuit.

In still another embodiment of the invention, the RF input matching circuit includes at least one spiral-type inductor formed on one of the respective faces of the substrate, a central portion of the spiral-type inductor being connected to the RF terminal via a through hole and a wire connected to the through hole and formed on the other one of the respective faces of the substrate.

In still another embodiment of the invention, a first LC resonance circuit or a first ¼ wavelength wire path is connected to a coupling point between the RF amplifier and the mixer and a second LC resonance circuit or a second ¼ wavelength wire path is connected to a coupling point between the LO amplifier and the mixer, the first and second LC resonance circuits or ¼ wavelength wire paths including a high-frequency grounding capacitor formed inside the semiconductor chip.

In still another embodiment of the invention, the first LC resonance circuit or ¼ wavelength wire path connected to the coupling point between the RF amplifier and the mixer and the second LC resonance circuit or ¼ wavelength wire path connected to the coupling point between the LO amplifier and the mixer are provided on the substrate, and wherein no output matching circuit corresponding to the mixer is provided on the substrate.

In still another embodiment of the invention, a grounding electrode is provided in a portion of a front face of the substrate where the semiconductor chip is mounted.

In still another embodiment of the invention, a wire width of supply wiring on the substrate is equal to a minimum wire width within the substrate.

In still another embodiment of the invention, the at least one terminal includes at least one supply terminal, and each one of the at least one supply terminal is connected to a plurality of inductors, a wire width of wiring for connecting the plurality of inductors being equal to a minimum wire width within the substrate.

In still another embodiment of the invention, a short-circuiting conductor is provided between adjoining portions of a conductor constituting the at least one inductor on the substrate.

In still another embodiment of the invention, a plurality of materials having different dielectric constants from one another are used as the highly dielectric material.

In still another embodiment of the invention, the semiconductor chip is mounted on the substrate with flip-chip bonding involving an MBB (MicroBump Bonding) method or an SBB (Stud Bump Bonding) method.

In still another embodiment of the invention, wherein the semiconductor chip is affixed on the substrate by using resin.

In still another embodiment of the invention, the at least one terminal has a concave shape with respect to a side face of the substrate.

In still another embodiment of the invention, the at least one terminal is formed by forming a through hole in a portion of the substrate corresponding to the at least one terminal while processing the substrate and then by cutting the through hole after coating at least an inner face of the through hole with a metal film; Preferably, the metal film associated with the at least one terminal has a polygonal or circular shape on a front face of the substrate.

In still another embodiment of the invention, the hybrid IC further includes a supply electrode and a ground electrode, each connected to the semiconductor chip, provided on one face of the substrate, at least one of the supply electrode and the ground electrode being connected to a supply electrode and a ground electrode provided on another face of the substrate via a plurality of through holes.

In still another embodiment of the invention, at least one of the terminals is provided at one of four corners of the substrate.

In still another embodiment of the invention, the substrate is composed of a material having a high dielectric constant. Preferably, the substrate is a ceramic substrate.

In still another embodiment of the invention, the substrate is composed of a material having a low dielectric constant. Preferably, the substrate is a glass epoxy substrate.

In still another embodiment of the invention, a pin electrode of a conductive material shaped so as to extend outward from the substrate is connected to each of the at least one terminal.

In still another embodiment of the invention, a plurality of the MIM capacitors are provided inside the semiconductor chip, lower electrodes included in the plurality of MIM capacitors being interconnected to one another.

In still another embodiment of the invention, the plurality of circuit elements included inside the semiconductor chip include first type circuit elements involving a signal having a large voltage and second type circuit elements involving a signal having a small voltage, the first type circuit elements being provided in an outer periphery of the semiconductor chip so as not to adjoin one another, and the second type circuit elements being provided among the first type circuit elements.

In still another embodiment of the invention, the plurality of circuit elements included inside the semiconductor chip include first type circuit elements having a high characteristics impedance and second type circuit elements having a low characteristics impedance, the first type circuit elements being provided in an outer periphery of the semiconductor chip so as not to adjoin one another, and the second type circuit elements being provided among the first type circuit elements.

In still another embodiment of the invention, the hybrid IC further includes a resin layer having a flat upper face and covering a front face of the substrate on which the semiconductor chip is mounted, the semiconductor chip being covered by the resin layer.

Thus, the invention described herein makes possible the advantage of providing a low cost high-frequency hybrid IC of a very small size in which no package is used and therefore no wire bonding process for interconnecting a package and a substrate is required, thereby miniaturizing a semiconductor chip included in the high-frequency hybrid IC.

This and other advantages of the present invention will become apparent to those skilled in the art upon reading and understanding the following detailed description with reference to the accompanying figures.

DESCRIPTION OF THE PREFERRED EMBODIMENTS

Example 1

Hereinafter, a hybrid IC 100 according to Example 1 of the present invention will be described with reference to FIGS. 2 to 8.

Figure 1:
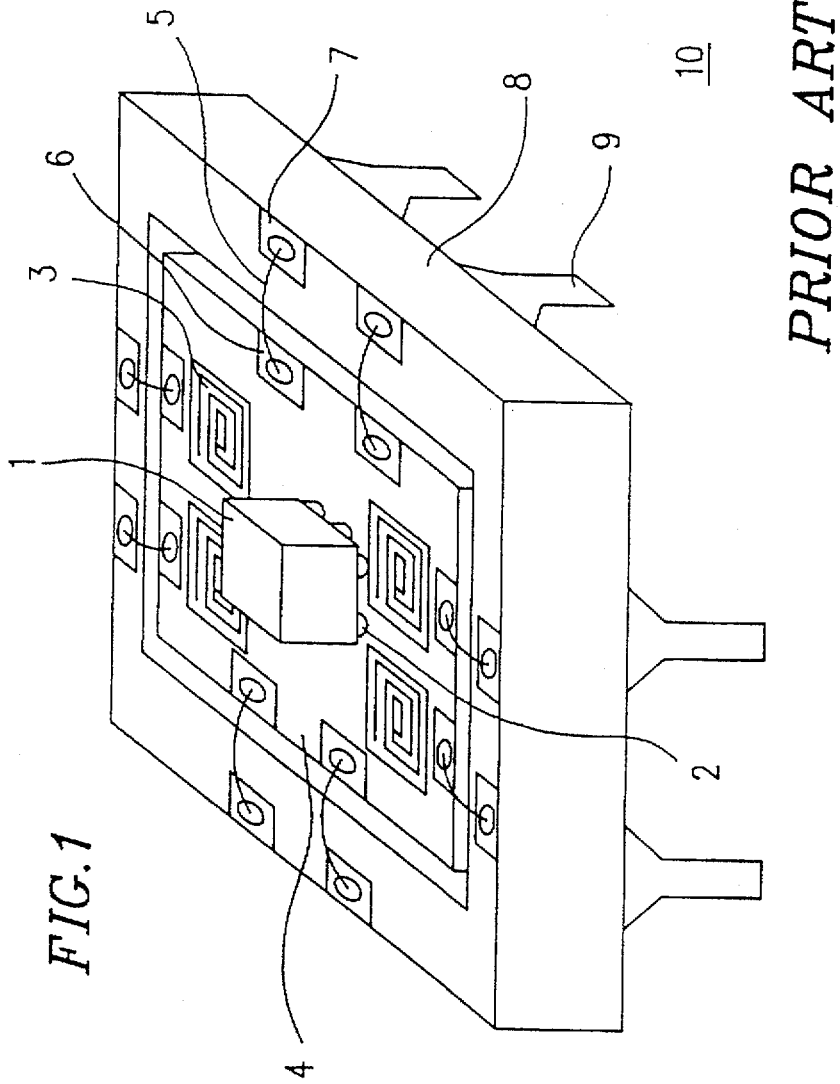
FIG. 1 is a perspective view showing an exemplary configuration for a conventional hybrid IC.
Figure 2:
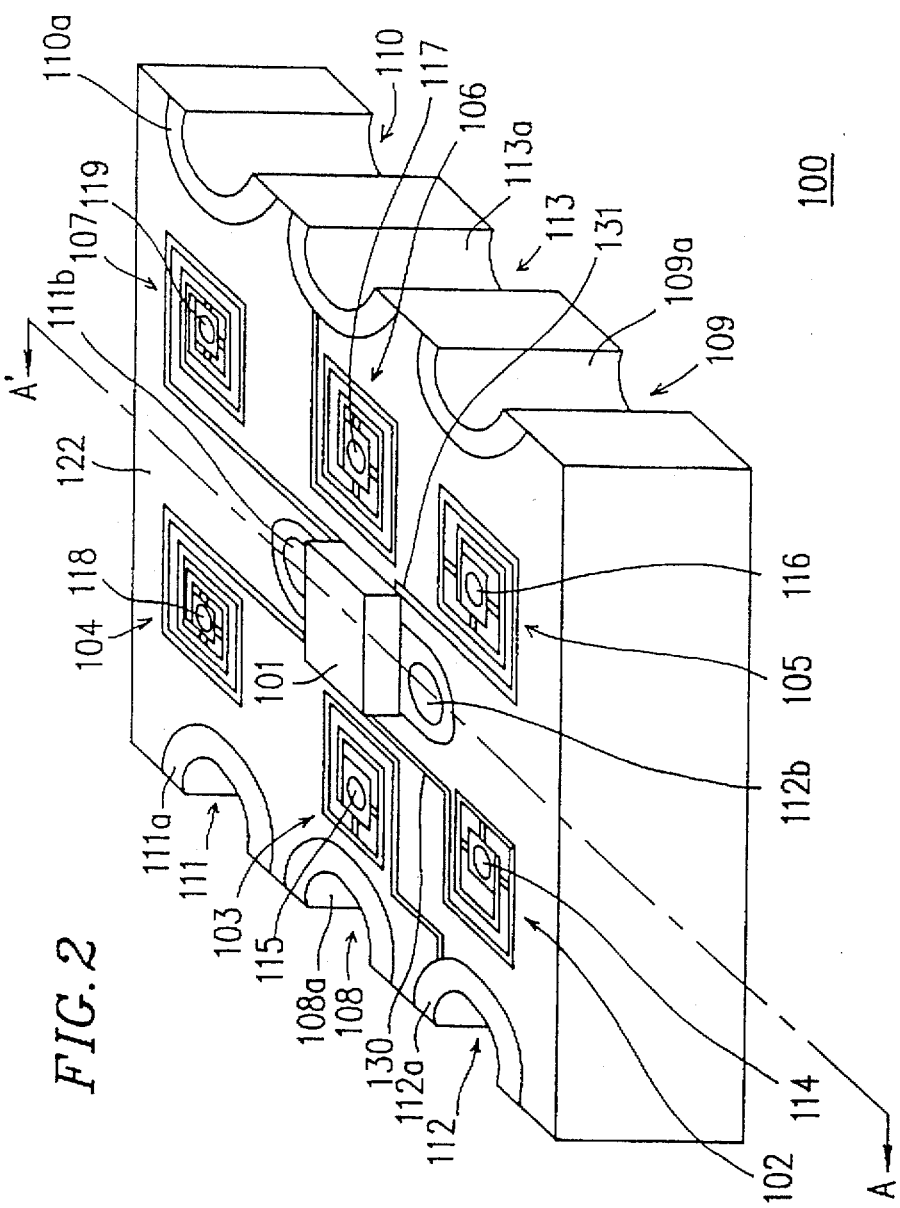
FIG. 2 is a perspective view showing a configuration for a hybrid IC according to Example 1 of the present invention.

FIG. 2 is a perspective view showing the hybrid IC 100 of the present example. As shown in FIG. 2, spiral-type inductors 102 to 107 are formed on a front face of a ceramic substrate 122 by using a single-layer wire consisting of a metal thin film. The inductors 102 to 107 are connected to a wiring pattern (not shown in FIG. 2) formed on a back face of the ceramic substrate 122 via through holes 114 to 119, respectively. Interconnection between the ceramic substrate 122 and external circuitry is achieved by means of terminals 108 to 113 formed on end faces of the ceramic substrate 122 in concave shapes.

The terminals 108 to 113 are formed as follows, for example. The ceramic substrate 122 is obtained by splitting a substrate having a large area at predetermined lines. Prior to the splitting process, a plurality of through holes are formed along lines (split lines) along which the splitting is to be conducted, an inner face of each through holes being plated with Au. Thereafter, the substrate is split along the split lines, on which the through holes are aligned. Thus, the Au-plated through holes are split so as to form the respective terminals 108 to 113. As a result, Au-plating layers 108a to 113a are formed on the surfaces of the terminals 108 to 113, respectively, and in portions of the front face and the back face of the ceramic substrate 122 adjoining the respective terminals 108 to 113. The Au-plating layers 108a to 113a function to ensure the electrical interconnection between the ceramic substrate 122 and external circuitry.

Although each of the terminals 108 to 113 is shown in FIG. 2 to have a shape obtained by removing, from the ceramic substrate 122, a semi-cylindrical portion having a semi-circular cross section, their shapes are not limited thereto. For example, each of the terminals 108 to 113 may have a shape obtained by removing a prism-like portion having a rectangular cross section from the ceramic substrate 122. However, in the case where the terminals 108 to 113 are formed by the above-mentioned method, the terminal shapes shown in FIG. 2 make for the simplification of the production process and the improvement of accuracy of the resultant terminal shapes.

The terminals 111 to 113 adjoining the terminals 108 to 110, which are input/output terminals for high-frequency signals, are always prescribed to be a supply terminal or a ground terminal, both of which have a low impedance. In FIG. 2, the terminal 111 is a supply terminal, whereas the terminals 112 and 113 are ground terminals. Such an arrangement is required in order to prevent high-frequency coupling between the respective terminals 108 to 113.

A semiconductor chip 101, e.g., a GaAs IC chip, is mounted in a face-down manner on the front face of the ceramic substrate 122. Capacitors composed of a highly dielectric material, resistors formed by an ion implantation method or a thin-film forming method, and FETs are formed on a front face (not shown in FIG. 2) of the semiconductor chip 101. Through holes 111b and 112b are formed so as to adjoin the semiconductor chip 101. The through hole 111b is connected to the supply terminal 111 via the wiring pattern formed on the back face of the ceramic substrate 122. Similarly, the through hole 112b is connected to the ground terminals 112 and 113 via the wiring pattern formed on the back face of the ceramic substrate 122. Furthermore, the semiconductor chip 101 is connected to the through holes 114 and 116 via an RF (Radio Frequency) signal line 130 and an LO (Local Oscillator) signal line 131. The through holes 114 and 116 are connected to the RF terminal 108 and the LO terminal 109, respectively, via the wiring pattern formed on the back face of the ceramic substrate 122 as described later.

The outermost wiring of the inductor 103 having a spiral structure is connected to the ground terminal 112 so as to ground the inductor 103, so that the impedance of the inductor 103 decreases from a central portion toward the outer periphery of the spiral. As a result, even if an LO leak power generated inside the inductor chip 101 is transmitted on the RF signal line 130, for example, the low-impedance wiring of the inductor 103, which adjoins the RF signal line 130 provides a shielding effect, thereby preventing the leak power from being directly coupled to the RF terminal 108.

Figure 3:
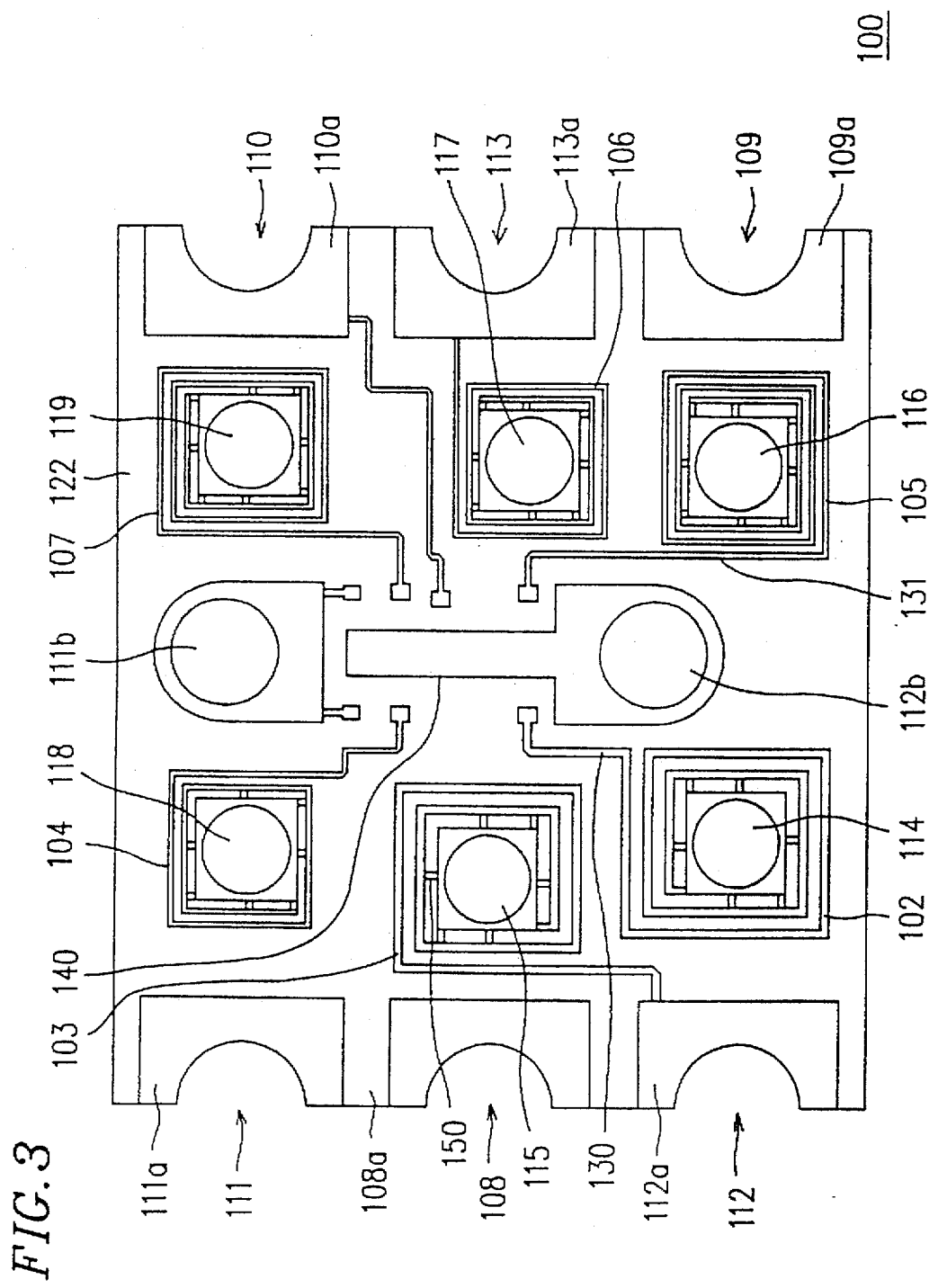
FIG. 3 is a top view of a ceramic substrate included in the hybrid IC shown in FIG. 2.

FIG. 3 is a top view showing the ceramic substrate 122 shown in FIG. 2 before the semiconductor chip 101 is mounted. Constituent elements which also appear in FIG. 2 are indicated by the same reference numerals as used therein, and the descriptions thereof are therefore omitted.

As shown in FIG. 3, a ground electrode 140 is provided in a portion of the ceramic substrate 122 where the semiconductor chip 101 is to be mounted. The ground electrode 140 is connected to the ground terminals 112 and 113 formed on the respective end faces of the ceramic substrate 122 via the through hole 112b. Thus, the ground electrode 140 functions to electrically separate RF signals from LO signals, thereby reducing the leak power from the LO signals to the RF signals.

In each of the spiral-type inductors 102 to 107, short-circuiting conductors 150 are provided between adjoining portions of a conductor constituting the inductor. The inductance values of the inductors 102 to 107 can be easily fine-adjusted by disrupting the short-circuiting conductors 150, as necessitated, by using a laser trimming apparatus or the like.

The wiring resistance of the spiral-type inductors 102 and 103, which are included in an RF input matching circuit (to be described later), affects the input loss thereof. Therefore, in order to reduce the wiring resistance of the spiral-type inductors 102 and 103, the width of the wire (hereinafter referred to as the "wire width") and the interval between portions of the wire are both prescribed to be 50 µm. On the other hand, the losses of the spiral-type inductors 105 and 106, which are included in an LO input matching circuit (to be described later), and the interstage load inductors 104 and 107 do not exercise a substantial effect, so that the wire width and wire interval thereof are both prescribed to be 30 µm in order to reduce the area occupied by the inductors 104, 105, 106, and 107. Thus, the size of the ceramic substrate 122 is minimized.

Figure 4:
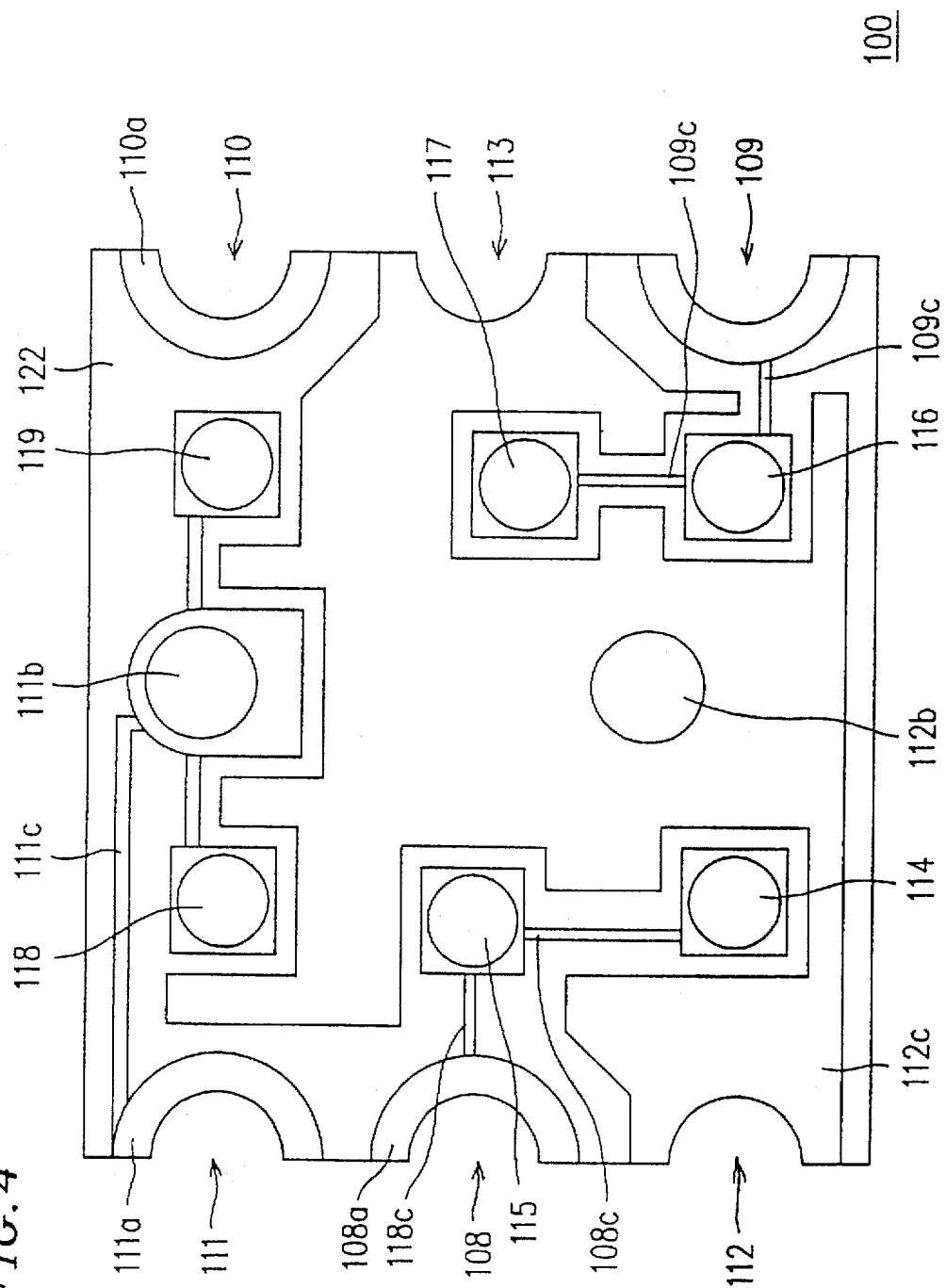
FIG. 4 is a back view of the ceramic substrate shown in FIG. 3.

FIG. 4 shows the back face of the ceramic substrate 122. However, FIG. 4 is illustrated as viewed from the front face, as if the ceramic substrate 122 was transparent, for clarity of description. Thus, the relative positions of the constituent elements shown in FIGS. 2 and 3 are conserved in FIG. 4. Constituent elements which also appear in FIGS. 2 and 3 are indicated by the same reference numerals as used therein.

Hereinafter, the wiring pattern on the back face of the ceramic substrate 122 and a flow of a signal input thereto will be described with reference to FIGS. 3 and 4.

An RF signal which is input at the RF terminal 108 is transmitted to the inductors 102 and 103 provided on the front face of the ceramic substrate 122 via the through holes 114 and 115, which are interconnected with the RF terminal 108 by means of a signal line 108c provided on the back face of the ceramic substrate 122. Moreover, the RF signal is input to the RF input terminal of the semiconductor chip 101 from the inductor 102 via the RF signal line 130.

An LO signal which is input at the LO terminal 109 is transmitted to the inductors 105 and 106 provided on the front face of the ceramic substrate 122 via the through holes 116 and 117, which are interconnected with the LO terminal 109 by means of a signal line 109c provided on the back face of the ceramic substrate 122. Moreover, the LO signal is input to the LO input terminal of the semiconductor chip 101 from the inductor 105 via the LO signal line 131.

The supply terminal 111 is connected to a supply terminal of the semiconductor chip 101 via the through hole 111b, which is connected to the supply terminal 111 by means of a signal line 111c provided on the back face of the ceramic substrate 122. Moreover, a ground wiring pattern 112c is provided so as to cover most of the back face of the ceramic substrate 122, the ground wiring pattern 112c being connected to the ground terminals 112 and 113.

Figure 5:
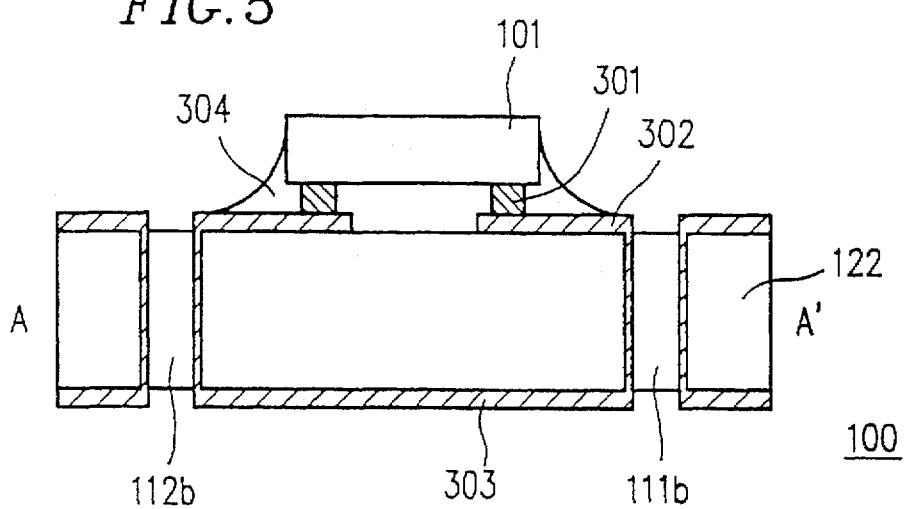
FIG. 5 is a cross-sectional view showing the hybrid IC shown in FIG. 2 taken along the line A—A' in FIG. 2.

FIG. 5 shows a cross section of the hybrid IC 100 taken along the line A—A' in FIG. 2. Constituent elements which also appear in FIGS. 2 to 4 are indicated by the same reference numerals as used therein. The metal wiring pattern provided on the front face of the ceramic substrate 122, as well as the metal wiring pattern provided on the back face of the ceramic substrate 122 and connected to the metal wiring pattern on the front face via the through holes 111b and 112b, are collectively represented by reference numerals 302 and 303 in FIG. 5, although the various wires included in the respective metal wiring patterns 302 and 303 are individually shown in FIGS. 2 to 4.

After Au bumps 301 are adhered to bonding pads on the semiconductor chip 101, the chip 101 is fixed in a predetermined position on the ceramic substrate 122 with the front face of the chip 101 down. The semiconductor chip 101 is affixed onto the ceramic substrate 122 by irradiating photosetting resin 304 with ultraviolet rays. Owing to the contraction of the photosetting resin 304, the Au bump 301 is connected to the metal wiring pattern 302 on the front face of the ceramic substrate 122 with a low contact resistance value.

Upon affixing the semiconductor chip onto the ceramic substrate 122, the resin is cured while pressing the chip 101 toward the substrate 122. The photosetting resin 304 used above is cured in a short period of time and, consequently, cause little damage to the semiconductor chip 101 during the curing step. It is applicable to use thermosetting resin or rapid cure resin instead of photosetting resin.

Figure 6:
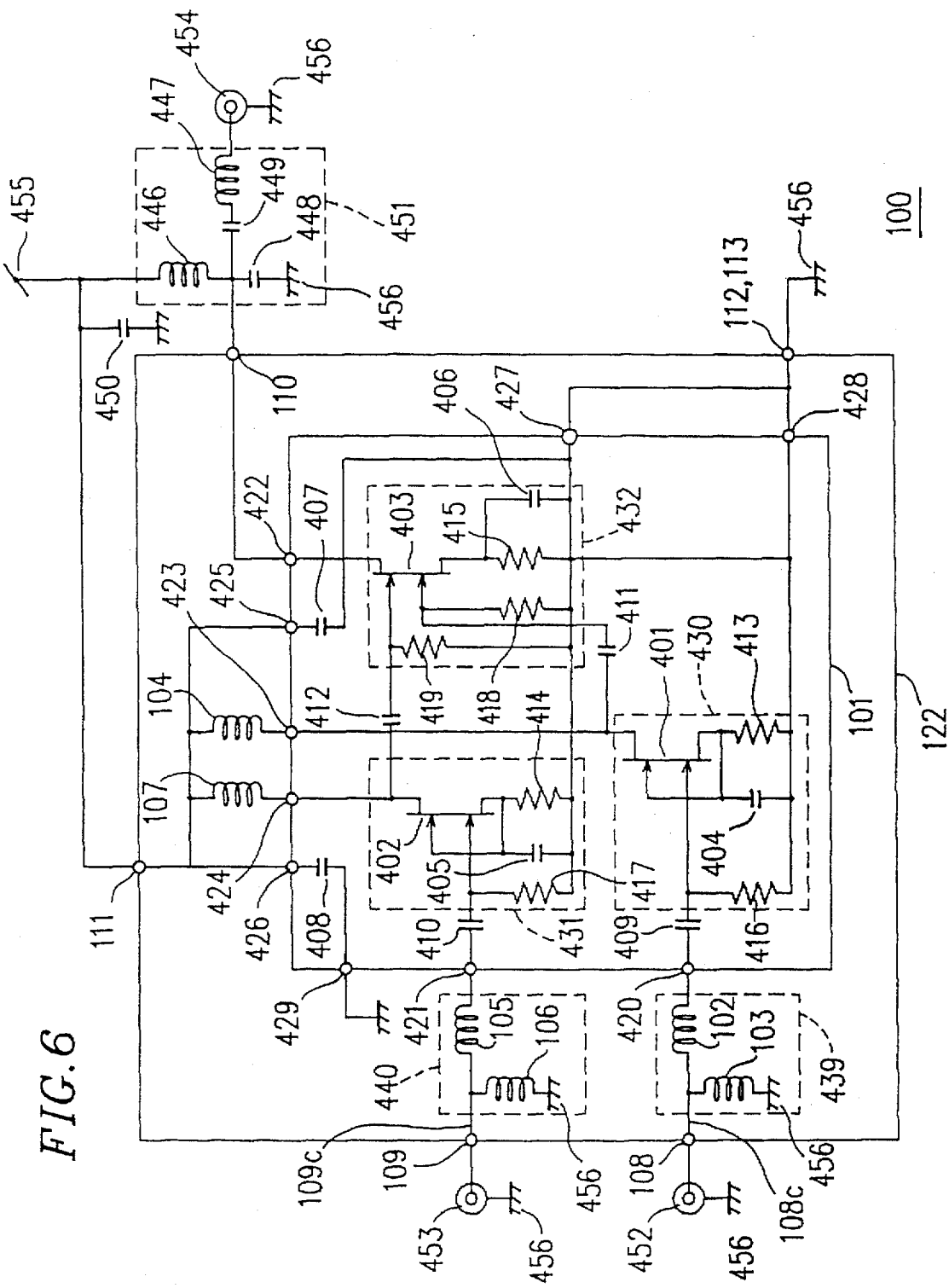
FIG. 6 is a circuit diagram showing the hybrid IC shown in FIG. 2.

FIG. 6 is a circuit diagram showing the hybrid IC 100 of the present example and peripheral circuitry thereof. Portions in FIG. 6 which correspond to the terminals 108 to 113 in FIGS. 2 to 4 are indicated by the same reference numerals as used therein.

As shown in FIG. 6, the semiconductor chip 101, which includes an RF amplifier 430, an LO amplifier 431 and a mixer 432, is mounted on the ceramic substrate 122 by flip-chip bonding. Moreover, an RF input matching circuit 439, an LO input matching circuit 440, the load inductor 104 of the RF amplifier 430, and the load inductor 107 of the LO amplifier 431 are further formed on the ceramic substrate 122. The load inductor 104 of the RF amplifier 430 and the load inductor 107 of the LO amplifier 431 are both connected to the supply terminal 111.

The RF input matching circuit 439 is of a type commonly referred to as a "serial-parallel type", and is composed essentially of the serial inductor 102, which is connected in series to the signal line 108c, and the parallel inductor 103, which is connected in parallel between the signal line 108c and a ground electrode 456. The LO input matching circuit 440 is similarly of a serial-parallel type, and is composed essentially of the serial inductor 105, which is connected in series to the signal line 109c, and the parallel inductor 106, which is connected in parallel between the signal line 109c and the ground electrode 456.

In FIG. 6, the parallel inductors 103 and 106 are located near the input side of the RF input matching circuit 439 and the LO input matching circuit 440, respectively. Alternatively, the serial inductors 102 and 105 may be located near the input side of the RF input matching circuit 439 and the LO input matching circuit 440.

In the hybrid IC 100 of the present example, a d.c. interrupting capacitance 409 connected to an input line for the RF amplifier 430, a connection capacitance 411 between the RF amplifier 430 and the mixer 432, a d.c. interrupting capacitance 410 connected to an input line for the LO amplifier 431, and a connection capacitance 412 between the LO amplifier 431 and the mixer 432 are integrated inside the semiconductor chip 101.

Moreover, ground capacitances 407 and 408 for grounding, in high-frequency terms, a supply side of the load inductor 104 of the RF amplifier 430 and a supply side of the load inductor 107 of the LO amplifier 431 are similarly integrated inside the semiconductor chip 101. The ground capacitances 407 and 408 are formed by using a highly dielectric material as an insulation films therein.

The RF amplifier 430 is composed essentially of a dual gate FET 401, which is self-biased by bias resistors 413 and 416. Similarly, the LO amplifier 431 is composed essentially of a dual gate FET 402, which is self-biased by bias resistors 414 and 417. The mixer 432 is composed essentially of a dual gate FET 403, which is self-biased by bias resistors 415, 418, and 419. The respective source electrodes of the dual gate FETs 401 to 403 are grounded in high-frequency terms via the ground capacitances 404 to 406 composed of highly dielectric materials.

An IF (Intermediate Frequency) signal obtained through a frequency conversion by the mixer 432 is matched to the characteristics impedance of the external circuitry by an IF output matching circuit 451, which is provided outside the ceramic substrate 122 carrying the hybrid IC 100 of the present invention. Thereafter, the IF signal is output via an IF output terminal 454. The IF output matching circuit 451 is composed essentially of an inductor 446 connected in parallel between a power supply 455 and a signal line, a ground capacitance 448 connected in parallel between the signal line and the ground electrode 456, and an inductor 447 and a capacitance 449 connected in series to the signal line.

Moreover, a ground capacitance 450 is connected to a supply line interconnecting the power supply 455 with the supply terminal 111 of the ceramic substrate 122.

In the present example, the semiconductor chip 101 is mounted in a face-down manner on the ceramic substrate 122 by a MBB (MicroBump Bonding) method so as to interconnect circuit elements inside the semiconductor chip 101 with the other circuit elements present on the ceramic substrate 122. Specifically, Au bumps are adhered onto bonding pads 420 to 429 of the semiconductor chip 101, and the semiconductor chip 101 is accurately disposed on corresponding bonding pad positions on the ceramic substrate 122 with the front face of the semiconductor chip 101 down. Thereafter, as described above with reference to FIG. 5, the semiconductor chip 101 is affixed onto the ceramic substrate 122 by means of resin, e.g., photosetting resin. A SBB (Stud Bump Bonding) method may be alternatively used for the mounting of the semiconductor chip 101, instead of the MBB method.

According to the present example, the frequency of the RF signal is typically 880 MHz; the frequency of the LO signal is typically 790 MHz; and the frequency of the IF signal is typically 90 MHz. Since the frequency of the IF signal is very low with respect to those of the RF signal and the LO signal, the inductance values of the inductors 446 and 447 included in the IF output matching circuit 451 become 10 times or more as large as the inductance values of the inductors 102 and 103 included in the RF input matching circuit 439 and those of the inductors 105 and 106 included in the LO input matching circuit 440. As a result, the formation of the IF output matching circuit 451 on the ceramic substrate 122 would result in an extreme increase in the area of the ceramic substrate 122, and in turn an increase in the production cost of the hybrid IC 101.

According to the present example, however, only those portions of the circuitry which may best be formed on the ceramic substrate 122 to result in a substantial advantage are formed on the ceramic substrate 122 in an integrated manner. Thus, the performance of the hybrid IC 101 is increased while realizing a low production cost.

The width of any supply wiring provided on the ceramic substrate 122 is made equal to the minimum wiring width in the ceramic substrate 122. The width of any wiring for connecting the load inductors 104 (of the RF amplifier 430) and 107 (of the Lo amplifier 431) to the supply terminal 111 is also made equal to the minimum wiring width within the ceramic substrate 122.

Figure 7:
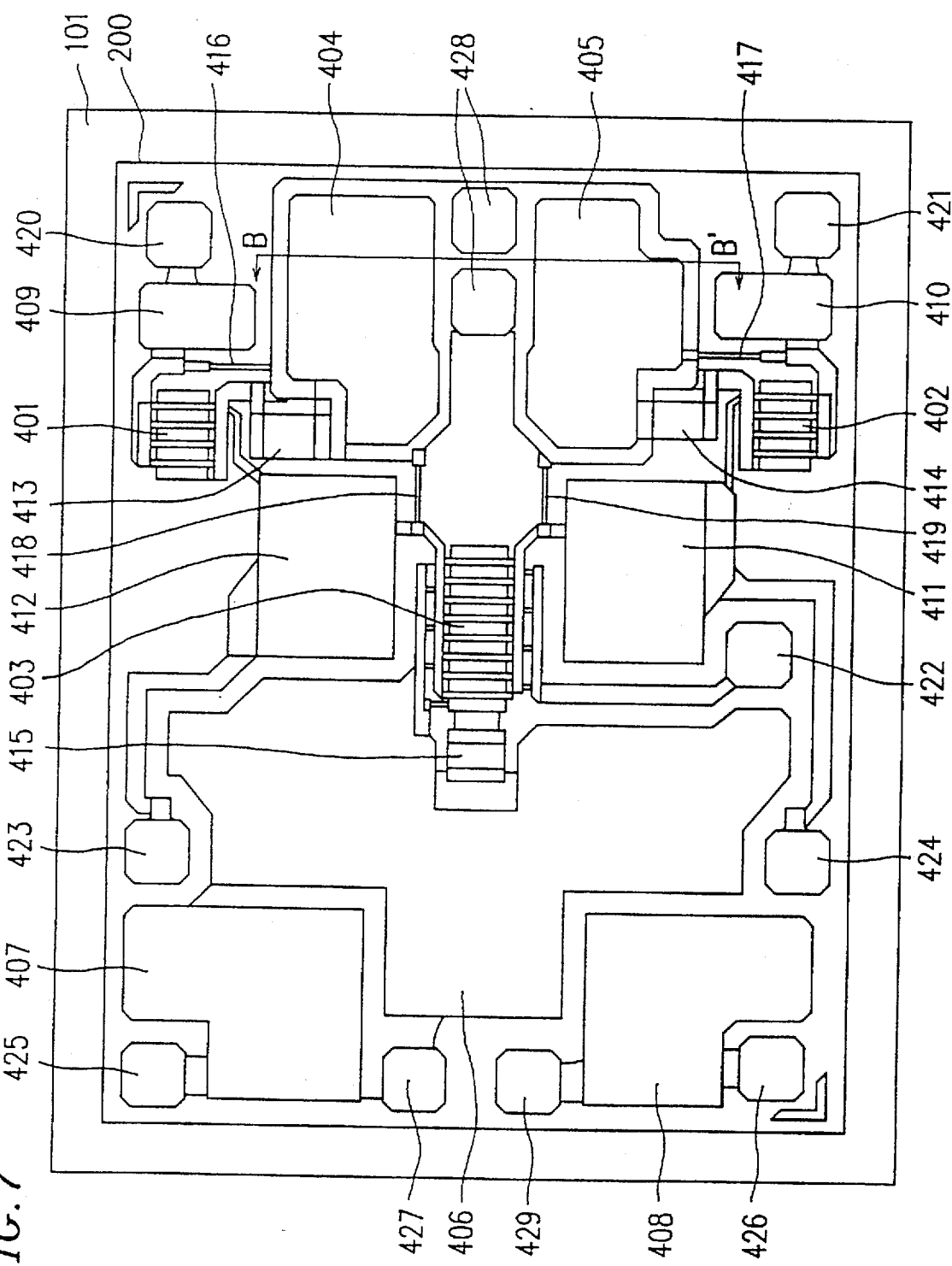
FIG. 7 is a plan view showing an exemplary arrangement of circuit elements of a semiconductor chip corresponding to the circuit diagram shown in FIG. 6.

FIG. 7 is a plan view showing a specific arrangement of the circuit elements of the semiconductor chip 101 corresponding to the circuit diagram shown in FIG. 6. Constituent elements which also appear in FIG. 6 are indicated by the same reference numerals as used therein.

In the semiconductor chip 101, MESFETs and resistors are formed on a GaAs substrate 200 by the ion implantation method. As for capacitors, an MIM (Metal-Insulator-Metal) structure is adopted, and two kinds of insulation films are used depending on the individual capacitors. Specifically, those which are required to have large capacitance values, e.g., the ground capacitances 407 and 408 for grounding the load inductors 104 and 107 of the RF amplifier 430 and the LO amplifier 431, are composed by using a strontium titanate film, as a highly dielectric material, having a relative dielectric constant of about 120. The other capacitances, whose capacitance values are required to be precise, are composed by using a silicon nitride film, as a low dielectric material, having a relative dielectric constant of about 7. This is because since the thickness of a silicon nitride film can be more accurately controlled, the capacitance values of the resultant capacitors can likewise be accurately controlled. However, the materials are not limited to those mentioned above. Examples of applicable highly dielectric materials are barium titanate strontium (BaSrTiO) and tantalum oxide (TaO). Examples of applicable low dielectric materials are silicon oxide ($SiO_2$) and silicon oxide nitride (SiON).

In the semiconductor chip 101 of the hybrid IC 100 of the present example, portions involving a relatively high signal voltage are disposed separately from portions involving a relatively low signal voltage, so that the coupling between different signals is prevented. Specifically, portions involving a high signal voltage and a high characteristics impedance (hereinafter referred to as the "first type circuit elements") are disposed in an outer periphery of the semiconductor chip 101 so as to be distant from one another. On the other hand, portions involving a low signal voltage and a low characteristics impedance (hereinafter referred to as the "second type circuit elements") are disposed inside the semiconductor chip 101 and among the first type circuit elements.

Specifically, in the RF signal system, the bonding pads 420 and 423, the d.c. interrupting capacitance 409, the FET 401, and the connection capacitance 411 are disposed in the outer periphery of the chip 101. In the LO signal system, the bonding pads 421 and 424, the d.c. interrupting capacitance 410, the FET 402, and the connection capacitance 412 are disposed in the outer periphery of the chip 101. The signal voltage applied to these circuit elements and the characteristics impedance of these circuit elements are both high. On the other hand, circuit elements to which low signal voltages are applied and which have low characteristics impedance, i.e., the ground capacitances (bypass capacitors) 404 and 405, are disposed between the RF signal system and the LO signal system inside the semiconductor chip 101.

In the mixer 432, too, the bypass capacitor 406, which has low characteristics impedance, is disposed inside the semiconductor chip 101 in an integrated manner, so as to separate the RF signal from the LO signal.

In accordance with the above-described arrangement, the high-frequency coupling between RF signals and LO signals is prevented, whereby excellent high-frequency characteristics are obtained.

An operation of the hybrid IC 100 of the present example will be described with reference to the circuit diagram shown in FIG. 6.

An RF signal input at an RF input terminal 452 is input to the RF input matching circuit 439 via the RF terminal 108, which is one of the terminals provided on the end faces of the ceramic substrate 122. Thereafter, the RF signal is input to a first gate of the dual gate FET 401 of the RF amplifier 430 so as to be amplified by the FET 401. Then, the RF signal is input to a first gate of the dual gate FET 403 of the mixer 432 via the connection capacitance 411.

Similarly, an LO signal input at an LO input terminal 453 is input to the LO input matching circuit 440 via the LO terminal 109, which is one of the terminals provided on the end faces of the ceramic substrate 122. Thereafter, the LO signal is input to a first gate of the dual gate FET 402 of the LO amplifier 431 so as to be amplified by the FET 402. Then, the LO signal is input to a second gate of the dual gate FET 403 of the mixer 432 via the connection capacitance 412.

The dual gate FET 403 of the mixer 432 subjects the RF signal and the LO signal to a frequency conversion, so as to output an IF signal having frequency components equivalent to a sum and a difference between the respective frequencies of the RF signal and the LO signal. The IF signal is input to the IF output matching circuit 451 via the IF terminal 110, which is one of the terminals provided on the end faces of the ceramic substrate 122, and is output via the IF output terminal 454 to any circuitry in a subsequent stage.

The inductor 104 is employed as a load for the RF amplifier 430. The inductor 104, a drain-gate capacitance $C_{gd}$ of the dual gate FET 401, and a first gate-source capacitance $C_{gs}$ of the dual gate FET 403 constitute a parallel resonance circuit. Accordingly, by ensuring that the resonance frequency of the parallel resonance circuit coincides with the frequency of the RF signal, the RF amplifier 430 can have a high gain.

Similarly, the LO amplifier 431 can also have a high gain, since a parallel resonance circuit is constituted by the load inductor 107, a drain-gate capacitance $C_{gd}$ of the dual gate FET 402, and a second gate-source capacitance $C_{gs}$ of the dual gate FET 403.

Alternatively, each of the load inductors 104 and 107 of the RF amplifier 430 and the LO amplifier 431, respectively, may be replaced by a ¼ wavelength wire path without undermining the performance of the hybrid IC 100.

The RF input matching circuit 439 and the LO input matching circuit 440 are designed based on the same principle. As for the RF input matching circuit 439, for example, the serial inductor 102 is connected to the first gate electrode of the dual gate FET 401, and the parallel inductor 103 is connected to the input side of the serial inductor 102. Owing to this configuration, the inductance values of the inductors 102 and 103 can be made smaller than the inductance values obtained with any other circuit configuration. As a result, the area occupied by the matching circuit 439 can be reduced. The same principle applies to the LO input matching circuit 440.

Although spiral-type inductors are used for the inductors 102 to 107 so as to miniaturize the hybrid IC 100 in the present example, meander-type inductors may alternatively be used. Spiral-type inductors are more advantageous in terms of characteristics than meander-type inductors because a spiral-type inductor can have a larger inductance value per unit area than does a meander-type inductor. On the other hand, meander-type inductors can be produced at lower costs because they do not require as many through holes to be formed as spiral-type inductors.

Hereinafter, the structures of the various capacitances according to the present example will be described with reference to FIGS. 8A and 8B.

Figure 8A:
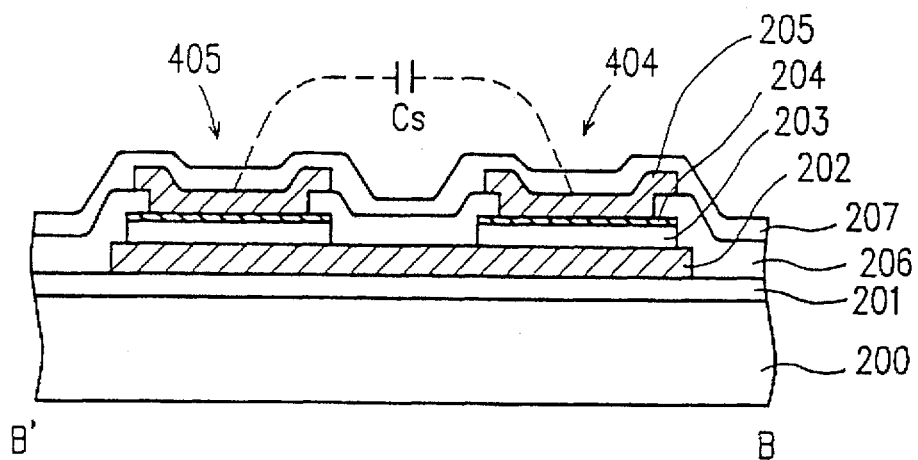
FIG. 8A is a cross-sectional view taken along the line B—B' in FIG. 7, showing the configurations of capacitances according to an example of the present invention.

FIG. 8A is a cross-sectional view taken along the line B—B' in FIG. 7, and shows the structures of ground capacitances 404 and 405 included in the RF amplifier 430 and the LO amplifier 431, respectively. FIG. 8B is a cross-sectional view showing an exemplary configuration in the case where the configuration shown in FIG. 8A is formed by a conventional technique.

Figure 8B:
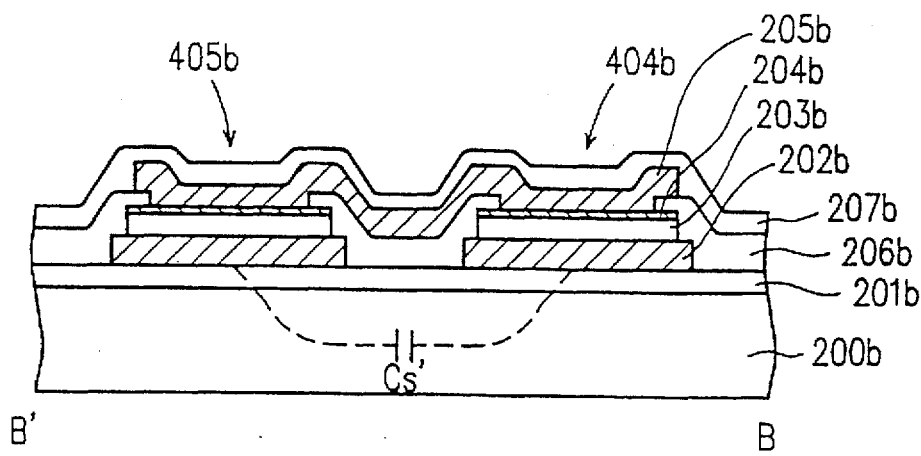
FIG. 8B is a cross-sectional view showing an exemplary configuration in the case where the configuration shown in FIG. 8A is formed by a conventional technique.

In FIG. 8B, any constituent elements are indicated by the same reference numeral of corresponding elements in FIG. 8A but with addition of the letter "b" at the end.

As shown in FIG. 8A, a first interlayer film 201 is deposited on the GaAs substrate 200. A lower electrode 202, which is patterned into an appropriate size, is formed on the first interlayer film 201. The lower electrode 202 functions as a ground electrode common to the two ground capacitances 404 and 405.

On the lower electrode 202, a highly dielectric thin film 203, a capacitor electrode 204, and an upper electrode 205 are provided for each of the ground capacitances 404 and 405. Portions other than where the ground capacitances 404 and 405 are formed are covered with a second interlayer film 206. The overall structure is further covered with a protection film 207.

On the other hand, according to conventional techniques in general, as shown in FIG. 8B, a first interlayer film 201b is deposited on a GaAs substrate 200b. Lower electrodes 202b, which are patterned into appropriate sizes, are separately formed on the first interlayer film 201b so as to correspond to ground capacitances 404b and 405b, respectively. On each lower electrode 202b, a highly dielectric thin film 203b and a capacitor electrode 204b are provided for each of the ground capacitances 404b and 405b. Portions other than where the ground capacitances 404b and 405b are formed are covered with a second interlayer film 206b. An upper electrode 205b is provided so as to cover this structure. Furthermore, the overall structure is further covered with a protection film 207b.

Thus, according to conventional techniques, the upper electrode 205b functions as a common ground electrode. In this case, a parasitic capacitance $C_s'$ present between the lower electrodes 202b corresponding to the respective ground capacitances 404b and 405b exist on the substrate 200b side, as shown in FIG. 8B. Since the substrate 200b has a high dielectric constant, this parasitic capacitance $C_s'$ has a relatively large value, thereby resulting in some high-frequency coupling between the two capacitances 404b and 405b.

On the other hand, according to the present example, the lower electrode 202 functions as a common ground electrode for the two ground capacitances 404 and 405. In this configuration, the parasitic capacitance $C_s$ is formed only above the lower electrode 202, as shown in FIG. 8A. As a result, the high dielectric constant of the GaAs substrate 200 does not affect the parasitic capacitance $C_s$. On the contrary, in the case where resin, e.g., epoxy resin, is filled in a portion where the parasitic capacitance $C_s$ is generated, the value of the parasitic capacitance $C_s$ can be reduced because such resin generally has a low dielectric constant.

Thus, by forming the capacitances of the configuration shown in FIG. 8A, the hybrid IC 100 according to the present example greatly reduces the high-frequency coupling between the two capacitances 404 and 405, thereby improving the high-frequency characteristics of the circuitry.

Although the ground capacitances 404 and 405 are exemplified in the above description, the capacitance configuration shown in FIG. 8A is applicable to any other capacitance included inside the semiconductor chip 101 of the hybrid IC 100 of the present example.

Example 2

Hereinafter, a hybrid IC 250 according to Example 2 of the present invention will be described with reference to FIG. 9.

Figure 9:
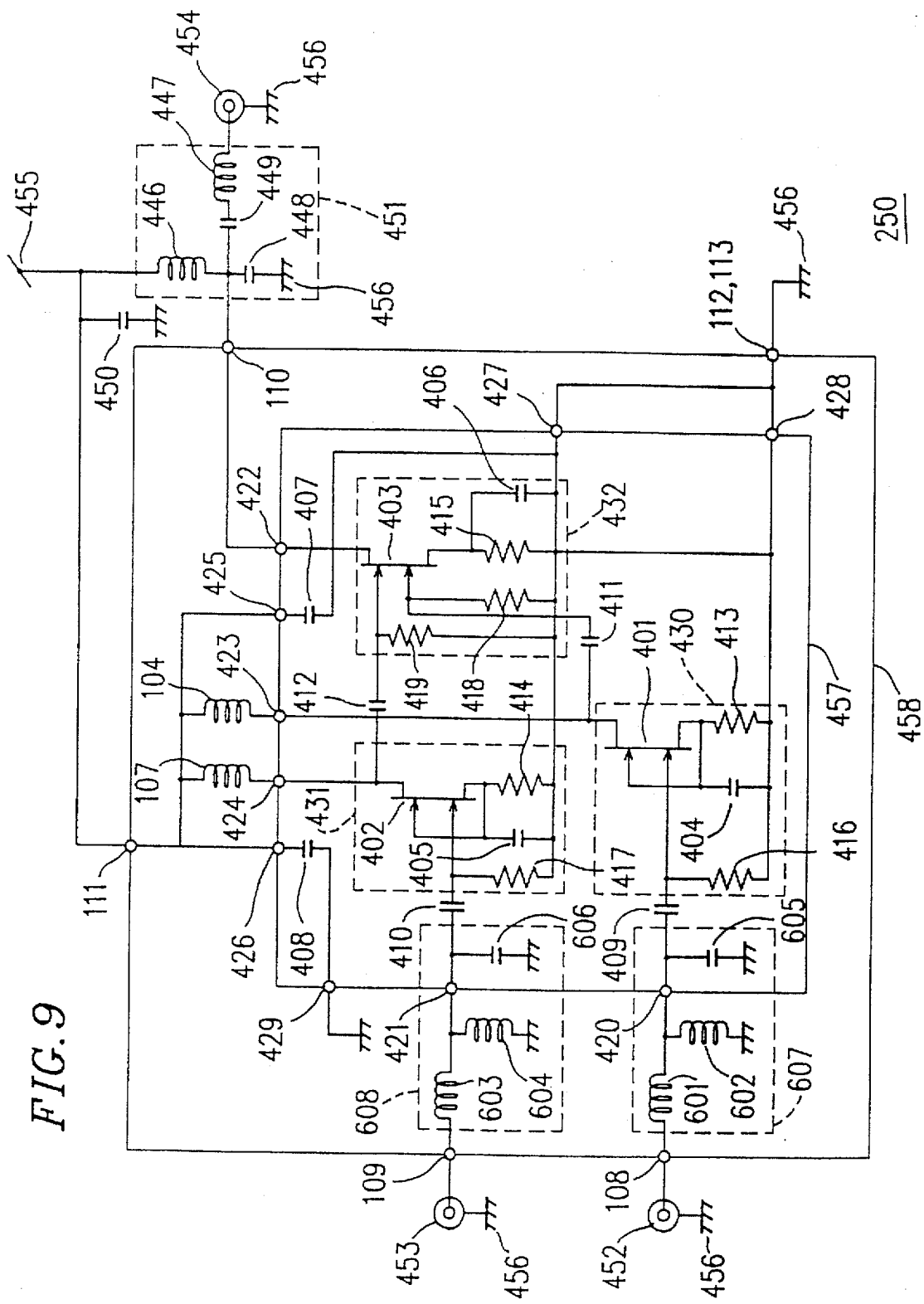
FIG. 9 is a circuit diagram showing a hybrid IC according to Example 2 of the present invention.

FIG. 9 is a circuit diagram showing the configuration of the hybrid IC 250 of the present example and peripheral circuitry thereof. The hybrid IC 250 shown in FIG. 9 differs from the hybrid IC 100 of Example 1 shown in FIG. 6 in that parallel capacitances 605 and 606 are added in an RF input matching circuit 607 and an LO input matching circuit 608, respectively, and that serial inductors 601 and 603 and parallel inductors 602 and 604 are connected in the opposite order with respect to the configuration shown in FIG. 6. Thus, the RF input matching circuit 607 and the LO input matching circuit 608 each have a "parallel-serial type inductors plus parallel capacitance" configuration. In FIG. 9, constituent elements which also appear in FIG. 6 are indicated by the same reference numerals as used therein, and the descriptions thereof are therefore omitted.

The RF input matching circuit 607 is composed essentially of the serial inductor 601, the parallel inductor 602, and the parallel capacitance 605, as shown in FIG. 9. Similarly, the LO input matching circuit 608 is composed essentially of the serial inductor 603, the parallel inductor 604, and the parallel capacitance 606, as shown in FIG. 9.

In the RF input matching circuit 607 and the LO input matching circuit 608 as described above, the inductors 601 to 604 are formed on a ceramic substrate 458 provided outside a semiconductor chip 457. The parallel capacitances 605 and 606 are both integrated inside the semiconductor chip 457. Specifically, the parallel capacitances 605 and 606 are formed by using MIM capacitances including silicon nitride as insulation films. By adopting this configuration, the inductance values of the parallel inductors 602 and 604 can be reduced, thereby making it possible to miniaturize the ceramic substrate 458 and realizing higher elimination capability of hinderance by an IF signal of an image frequency.

Example 3

Hereinafter, a hybrid IC 300 according to Example 3 of the present invention will be described with reference to FIG. 10.

Figure 10:
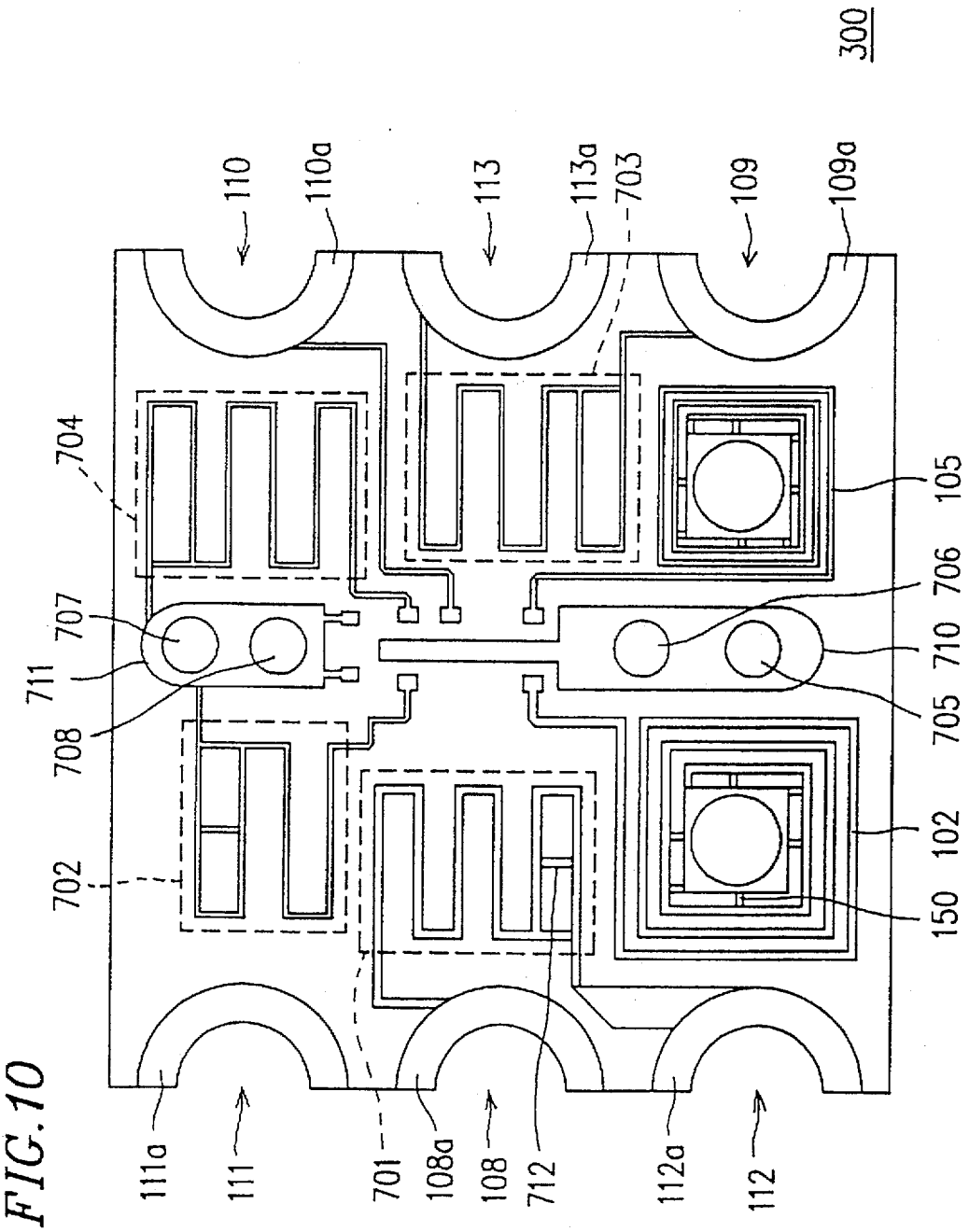
FIG. 10 is a top view showing a ceramic substrate included in a hybrid IC according to Example 3 of the present invention.

FIG. 10 is a top view showing a ceramic substrate included in the hybrid IC 300 of the present example. However, FIG. 10 shows the ceramic substrate before a semiconductor chip is mounted thereon. In FIG. 10, constituent elements which also appear in FIG. 3 (Example 1) are indicated by the same reference numerals as used therein, and the descriptions thereof are therefore omitted.

As shown in FIG. 10, the hybrid IC 300 of the present example incorporates meander-type inductors 701 to 704 in the place of some spiral-type inductors used in the hybrid ICs 100 and 250 of Examples 1 and 2. The inductors 701 and 102 in an RF input matching circuit are required to have a small loss, so that the wire width and wire interval thereof are both prescribed to be 50 μm. On the other hand, the losses of the inductors 703 and 105 (of the LO input matching circuit) and the interstage inductors 702 and 704 do not exercise a substantial effect, so that the wire width and wire interval thereof are both prescribed to be 30 μm in order to reduce the area occupied by the inductors 105 and 702 to 704. Thus, the size of the ceramic substrate is minimized.

In each of the meander-type inductors 701 to 704 and the spiral-type inductors 102 and 105, short-circuiting conductors 712 and 150 are respectively provided between adjoining portions of a conductor constituting the inductor. The inductance values of the inductors 102, 105, and 701 to 704 can be easily fine-adjusted by disrupting the short-circuiting conductors 712 or 150, as necessitated, by using a laser trimming apparatus or the like.

By adopting meander-type inductors 701 to 704, the number of through holes to be formed can be reduced. As a result, the production cost of the hybrid IC 300 is reduced.

On the other hand, according to the present example, a ground electrode 710, formed near where the semiconductor chip is mounted, includes two through holes 705 and 706. Similarly, a supply electrode 711 includes two through hole 707 and 708. The ground electrode 710 and the supply electrode 711 are connected to a predetermined wiring pattern provided on the other face of the ceramic substrate via the through holes 705 to 708. By employing a plurality of small through holes as those shown in FIG. 10, the inductance values of the through holes can be reduced as well as the size of the ceramic substrate.

The formation of a plurality of through holes as described above is applicable not only to a hybrid IC incorporating meander-type inductors as in the present example, but also applies to a hybrid IC incorporating only spiral-type inductors, such as those described in the other examples of the present invention.

Example 4

Hereinafter, a hybrid IC 400 according to Example 4 of the present invention will be described with reference to FIG. 11.

Figure 11:
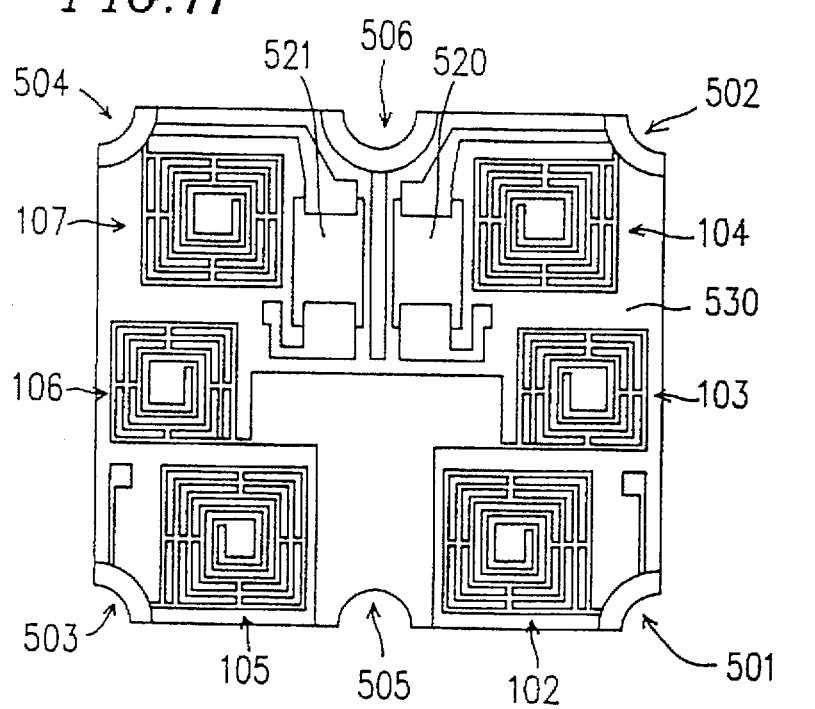
FIG. 11 is a top view showing a ceramic substrate included in a hybrid IC according to Example 4 of the present invention.
Figure 12:
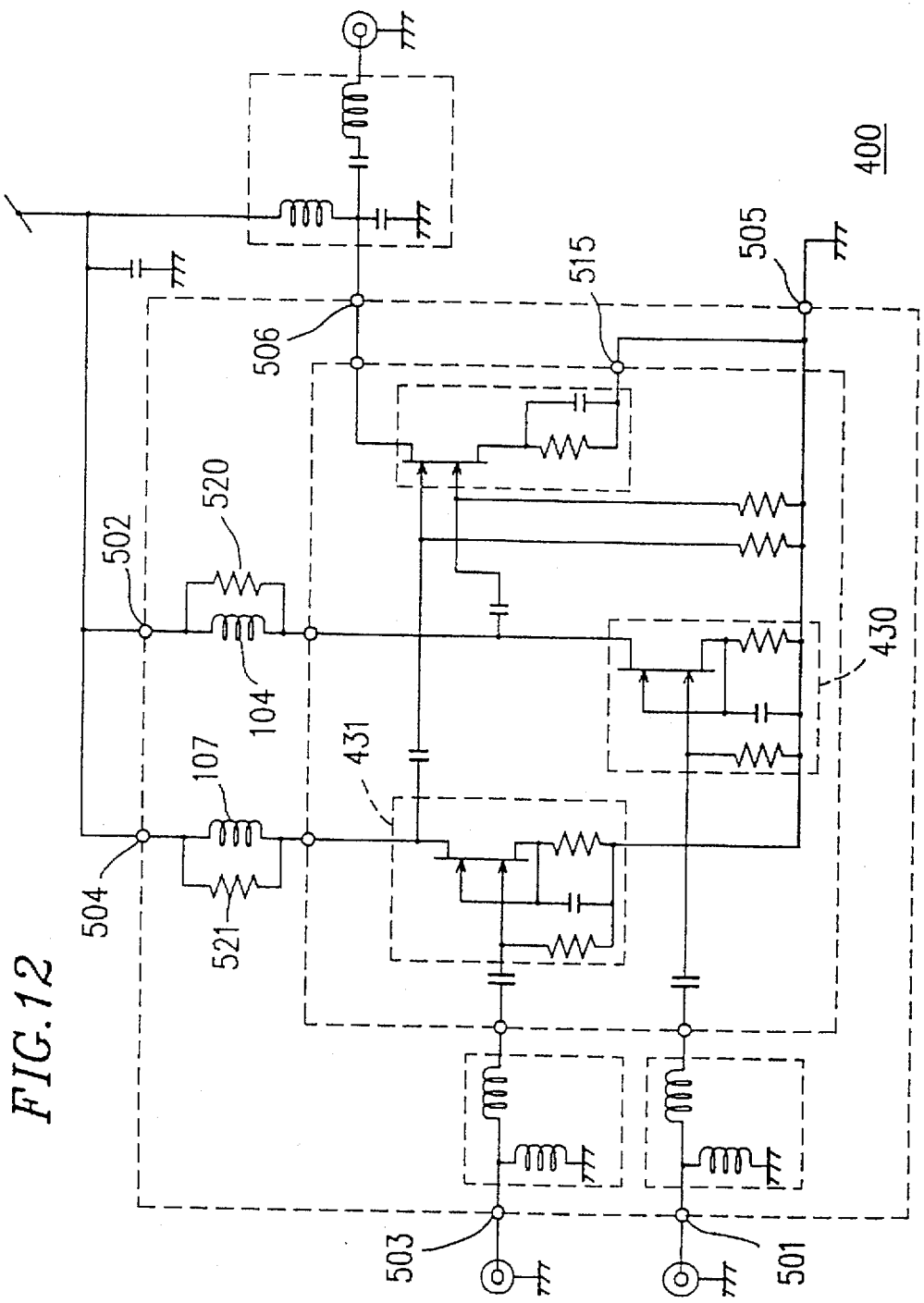
FIG. 12 is a circuit diagram showing the hybrid IC shown in FIG. 11

FIG. 11 is a top view showing the configuration of the hybrid IC 400 of the present example. FIG. 12 is a circuit diagram showing the hybrid IC shown in FIG. 11.

In the hybrid IC 400, some of a number of terminals formed on end faces of a substrate 530 are formed at the corners of the substrate 530 whereas others are formed on the sides of the substrate 530 (as seen from above). Specifically, an RF terminal 501, an LO terminal 503, and supply terminals 502 and 504 are formed at the corners of the substrate 530, whereas an IF terminal 506 and a ground terminal 505 are provided on opposing sides of the substrate 530. Owing to the formation of the terminals 501 to 504 at the corners of the substrate 530, the area of the substrate 530 is reduced.

On a front face of the substrate 530, circuit elements including spiral-type inductors 102 to 107 are formed. Since the circuit elements formed thereon are identical with those in the hybrid IC 100 in Example 1 shown in FIG. 3 except for resistors 520 and 521 (to be described later), the descriptions thereof are omitted. The actual arrangement of the circuit elements on the front face of the substrate 530 may be optimized with respect to the area of the substrate 530 employed.

The circuit configuration of the hybrid IC 400 of the present example shown in FIG. 12 is basically the same as that of the hybrid IC 100 of Example 1 shown in FIG. 6, except that the resistors 520 and 521 are connected in parallel with the load inductor 104 of an RF amplifier 430 and the load inductor 107 of an LO amplifier 431, respectively. As a result of this, the Q value of a resonance circuit constituted by the load inductor 104 or 107 can be freely adjusted, thereby preventing the circuit from oscillating.

The circuit elements shown in FIG. 12 other than the resistors 520 and 521 are identical with those of the hybrid IC 100 of Example 1 shown in FIG. 6, and the descriptions thereof are therefore omitted.

As described above, the substrate 530 is miniaturized according to the present example.

Example 5

Figure 13:
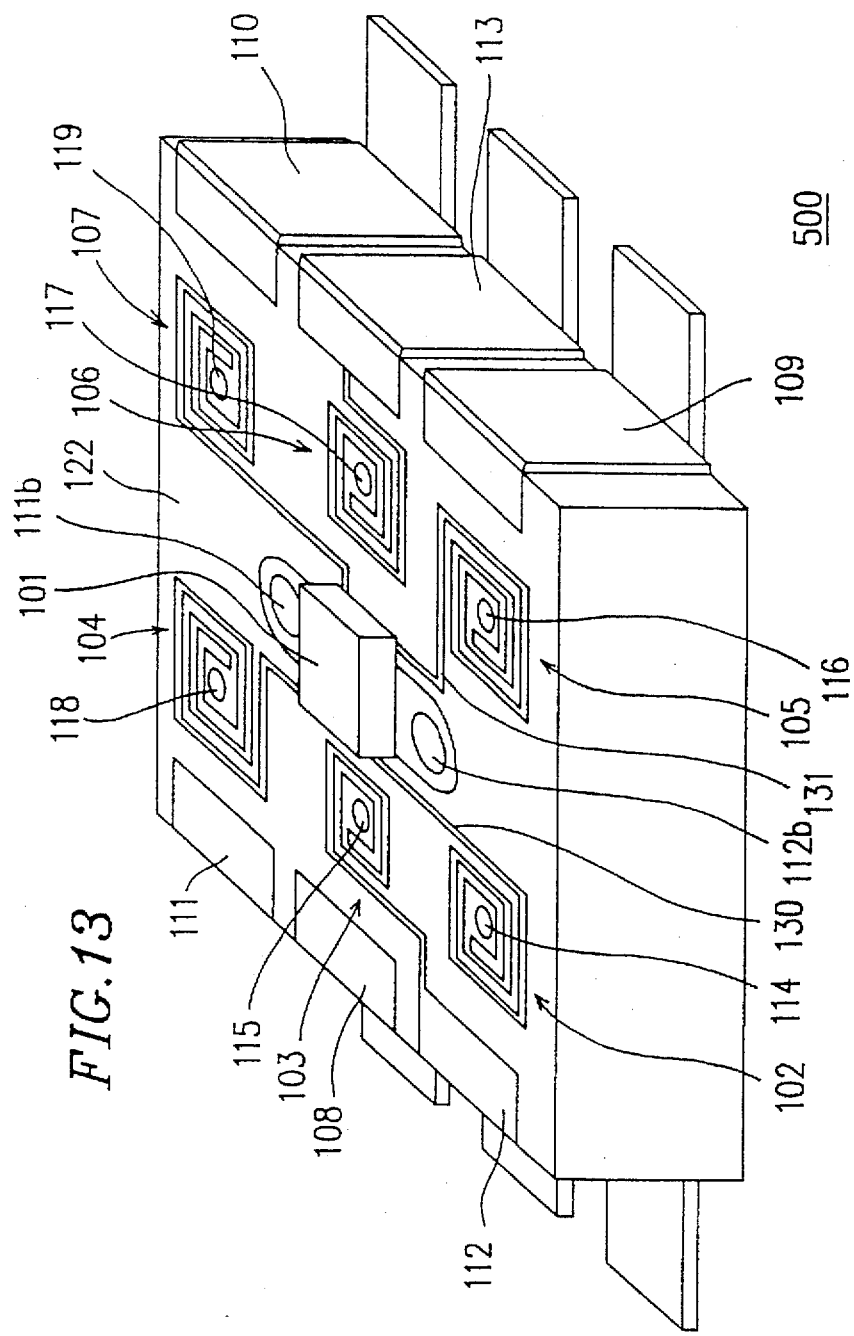
FIG. 13 is a perspective view showing a hybrid IC according to Example 5 of the present invention.

Hereinafter, a hybrid IC 500 according to Example 5 of the present invention will be described with reference to FIG. 13. In FIG. 13, constituent elements which also appear in FIG. 2 are indicated by the same reference numerals as used therein, and the descriptions thereof are therefore omitted, since they have similar functions and features although some of them are in a different arrangement with respect to FIG. 2.

FIG. 13 is a perspective view showing the hybrid IC 500 of the present example. As shown in FIG. 13, in the hybrid IC 500 of the present example, terminal pins composed of a conductive material such as a metal or a metal compound are further connected to terminals 108 to 113 provided on end portions (i.e., sides) of the ceramic substrate 122. As the material for the terminal pins, copper alloys generally used for lead frames for semiconductors are suitable. Specifically, each of the terminals 108 to 113 of the hybrid IC 100 of Example 1 shown in FIG. 2 are formed so as to have a shape obtained by removing a prism-like portion from the ceramic substrate 122, and terminal pins of a shape burying the concave portions defining the terminals 108 to 113 and extending out from the ceramic substrate 122 are connected to the terminals 103 to 108.

By employing terminal pins having the above-mentioned shapes, it becomes possible to mount the hybrid IC 500 on a circuit substrate by a conventional soldering technique, thereby preventing the increase in the assembly cost.

Example 6

Figure 14:
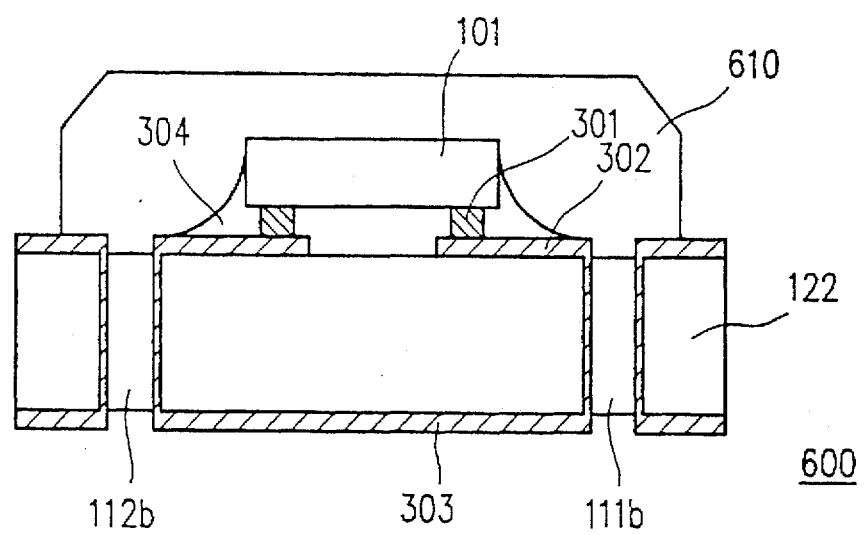
FIG. 14 is a cross-sectional view showing a hybrid IC according to Example 6 of the present invention.

Hereinafter, a hybrid IC 600 according to Example 6 of the present invention will be described with reference to FIG. 14. FIG. 14 corresponds to FIG. 5, which has been described in connection with Example 1 of the present invention. In FIG. 14, constituent elements which also appear in FIG. 5 are indicated by the same reference numerals as used therein, and the descriptions thereof are therefore omitted.

As described above, in any of the hybrid ICs 100 to 500 of Examples 1 to 5, the semiconductor chip is merely mounted on the ceramic substrate, that is, no particular step is conducted following the mounting of the semiconductor chip. However, according to the present example, resin is applied on a ceramic substrate 122, on which a semiconductor chip 101 has been flip-chip bonded, so as to form a resin layer 610 as shown in FIG. 14. An upper face of the resin layer 610 is made flat. The resin layer 610 is formed so as to cover at least the semiconductor chip 101, and spiral-type inductors formed on the front face of the ceramic substrate 122. The resin layer 610 may be formed of epoxy resin, silicone resin, and the like, for example.

As a result, it becomes possible to employ an inserter or the like when mounting the hybrid IC 600 on a circuit substrate, etc., thereby improving the productivity thereof. Moreover, as described in Example 1 with reference to FIGS. 8A and 8B, the resin 610 functions to reduce the capacitance value of any parasitic capacitance if generated.

The formation of the resin layer 610 is applicable not only to the hybrid IC 100 of Example 1, but also to any of the hybrid ICs described in Examples 2 to 5 of the present invention.

In any of Examples 1 to 6 described above, the hybrid IC of the present invention is formed on a ceramic substrate having a relatively high dielectric constant. However, it is applicable to employ a substrate having a relatively low dielectric constant, e.g., a glass epoxy substrate (dielectric constant: 4.0), instead of a ceramic substrate. By adopting a substrate composed of a material having such a low dielectric constant, it becomes possible to improve the resonance frequencies of the spiral-type inductors. As a result, the hybrid IC can be used in higher-frequency bands as compared with the case where a ceramic substrate is used as in the above description. Even if the hybrid IC is used in the same frequency band, the use of such a low dielectric substrate makes it possible to reduce the area occupied by the spiral-type inductors.

As has been described, in accordance with the hybrid IC of the present invention, terminals for connecting the circuitry within the hybrid IC to external circuitry are directly formed in the outer periphery of a substrate, thereby making unnecessary any wire bonding or use of a package, which is conventionally required for the connection with external circuitry. As a result, the number of the production steps is minimized, thereby making possible cost reduction and miniaturization of the hybrid IC. Moreover, the absence of bonding wires or packages prevents unfavorable influences on the high-frequency operation characteristics of the hybrid IC. As a result, the hybrid IC has excellent characteristics. Moreover, since a large-capacitance MIM capacitor composed of highly dielectric material is internalized in the semiconductor chip, there is no need of mounting any capacitors on the substrate as chip components. As a result, the area of the substrate can be reduced. Because of the above-mentioned aspects, a very compact and low-cost hybrid IC is realized according to the present invention.

By incorporating a matching circuit for matching any input signal to a circuit element inside the semiconductor chip, matching of impedance can be realized, which makes for excellent operation characteristics of the hybrid IC.

The inductors included in the above-mentioned matching circuit may be formed on the other side of the substrate, instead of inside the semiconductor chip. As a result, the size of the semiconductor chip can be prevented from increasing.

By so configurating the matching circuit as to include only inductors, the number of inductors required decreases as well as the area occupied by them. As a result, the hybrid IC can be miniaturized, and excellent image frequency suppression ratio and isolation characteristics can be obtained.

By grounding the outermost portion of the wiring constituting each spiral-type inductor, the voltage of the outermost portion of the spiral-type inductor, which adjoins other wiring, can be reduced. As a result, coupling with other signal lines can be prevented, thereby achieving excellent isolation characteristics.

By forming the matching circuit with inductors and capacitors, with the capacitors formed inside the semiconductor chip, the number of inductors required can be reduced, and the area of the substrate is prevented from increasing. As a result, an even smaller hybrid IC can be realized.

The inductors included in the matching circuit can be a spiral-type or a meander-type. Spiral-type inductors provide a large inductance value per unit area. Meander-type inductors result in a smaller number of through holes required.

By arranging the terminals formed in the outer periphery of the substrate in such a manner that a ground terminal or a supply terminal adjoins an RF terminal, an LO terminal, or an IF terminal, which are involved in the input/output of high-frequency signals, a configuration is realized in which the input and output terminals of high-frequency signals are sandwiched by low impedance terminals. As a result, the interference between high-frequency signals can be eliminated.

Since any high-frequency signal, e.g., an RF signal leaking out from the RF terminal, etc. can be released to the ground in high-frequency terms, the isolation characteristics between the input terminal for high-frequency signals and other terminals can be improved. As a result, the hybrid IC can be miniaturized while maintaining its excellent characteristics.

By prescribing the wire width of each inductor included in the RF input matching circuit, in which an increase in the wiring resistance affects the input loss, to be larger than that of each inductor in the LO input matching circuit, in which an increase in the wiring resistance does not substantially affect the input loss, the outer dimensions of the inductors can be further reduced, so that an even smaller hybrid IC can be realized.

Any wiring for connecting an RF input matching circuit and an RF terminal may be provided on a face of the substrate opposite to a face on which the RF input matching circuit is formed, so as to prevent signal lines related to RF signals (which are high-frequency signals) from coupling with other signal lines. As a result, excellent isolation characteristics can be obtained.

By providing an LC resonance circuit or a ¼ wavelength wire path including high-frequency grounding capacitors at coupling points between an RF amplifier and a mixer and between an LO amplifier and a mixer, the current consumption in the semiconductor chip can be reduced. Moreover, the high-frequency grounding capacitors may be provided inside the semiconductor chip, which requires no capacitance to be formed on the substrate, thereby reducing the size of the substrate.

By not forming an output matching circuit that corresponds to a mixer on a substrate on which the hybrid IC is formed, the size of the substrate and the production cost can be reduced.

A grounding wire may be provided in a portion of the front face of the substrate where the semiconductor chip is mounted because such a wire, provided between an input terminal and an output terminal on the front face of the substrate, functions to separate the input from the output. As a result, excellent isolation characteristics can be obtained.

By prescribing the wire width of supply wiring to be a small value which is equal to or smaller than the wire width of an LO signal line, the influence between elements connected to the same power supply, which occurs via the supply wiring, can be reduced. As a result, a hybrid IC having excellent characteristics can be obtained.

By prescribing the wire width of supply wiring connected to a plurality of inductors to be a minimum wire width in the substrate, the interaction between the inductors can be prevented.

By providing short-circuiting conductors in each inductor and disrupting the short-circuiting conductors when necessary, the inductance value of the inductor can be easily adjusted, whereby desired gain-noise characteristics can be obtained.

By composing MIM capacitors, formed inside the semiconductor chip, of a plurality of materials having different dielectric constants from one another, it becomes possible to select an optimum highly-dielectric material for each insulation film depending on the value and the desired accuracy of the capacitance. As a result, the semiconductor chip can be miniaturized and made accurate.

By mounting the semiconductor chip on the substrate with flip-chip bonding involving the MBB method or the SBB method, the area of bonding pads on the semiconductor chip and the ceramic substrate can be reduced, and the bonding pads on the ceramic substrate can be located on the lower face of the semiconductor chip. As a result, the ceramic substrate can be miniaturized.

By affixing the semiconductor chip onto the substrate by using resin, the adhesion between the semiconductor chip and the substrate increases as the resin cures, thereby increasing the adhesion strength between the semiconductor chip and the ceramic substrate as well as the reliability of the semiconductor chip. Moreover, the contact resistance of the various connections can be reduced, thereby providing secure electrical conduction for the connections.

By forming a terminal having a concave shape, solder flows into the concave portion of the terminal when soldering the substrate with a printed circuit board, whereby stable soldering is achieved.

The terminals of the substrate may be formed by forming a through hole in a portion of the substrate corresponding to the terminals while processing the substrate and then by cutting the through hole after coating at least an inner face of the through hole with a metal film. Thus, the terminals for the substrate can be easily fabricated, thereby providing a low cost hybrid IC.

According to the present invention, a metal film, formed in a portion on either face of the substrate that adjoins a terminal and functioning as a part of the terminal, may have a polygonal or circular shape. Thus, the area of the metal film can be reduced, thereby providing a low cost hybrid IC.

A supply electrode and a ground electrode may be further provided in such a manner that each electrode is connected to the semiconductor chip, provided on one face of the substrate, and at least one of the supply electrode and the ground electrode is connected to a supply electrode and a ground electrode provided on another face of the substrate via a plurality of through holes. Thus, the area of the supply electrodes and the ground electrodes can be reduced, so that the substrate can be miniaturized.

By forming terminals at the corners of the substrate, the area of the terminals can be reduced, thereby miniaturizing the substrate.

By using a highly-dielectric material for the substrate, the favorable influence of phase rotation based on the transmission wire path length increases, so that the area of the inductors can be reduced.

By using a low-dielectric material for the substrate, the resonance frequencies of spiral-type inductors can be improved, or the area required for the inductors to obtain the same inductance value can be reduced since the wire interval can be reduced.

By employing a pin electrode, it becomes possible to apply conventional soldering mounting techniques for the mounting of the hybrid IC on a circuit substrate, thereby preventing the assembly cost from increasing.

By interconnecting lower electrodes of a plurality of MIM capacitances formed inside the semiconductor chip to one another, no parasitic capacitance is generated on the substrate side, so that the adverse effect on the operation characteristics is reduced.

The circuit elements inside the semiconductor chip can be arranged in such a manner that any coupling between circuit elements involving high-frequency signals is reduced. Specifically, first type circuit elements involving a signal having a large voltage and/or a high characteristics impedance are provided in an outer periphery of the semiconductor chip so as not to adjoin one another. On the other hand, second type circuit elements involving a signal having a small voltage and/or a low characteristics impedance are provided among the first type circuit elements.

By forming a resin layer having a flat upper face, it becomes possible to employ a conventional inserter when mounting the hybrid IC on a circuit substrate, thereby preventing the assembly cost from increasing.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A hybrid IC comprising:
   a substrate including a front face, a back face opposite the front face, and side faces interposed between the front face and the back face which define an outer perimeter of the substrate;
   at least one inductor formed on at least one of the front face and the back face of the substrate;
   a semiconductor chip mounted on the front face of the substrate by flip-chip bonding;
   at least one terminal formed in a predetermined portion of the side faces of the substrate,
   wherein the semiconductor chip comprises a plurality of circuit elements provided therein, at least one of the plurality of circuit elements being an MIM capacitor having a metal-insulation film-metal (MIM) structure, the insulation film being composed of a highly dielectric material.

2. A hybrid IC according to claim 1 further comprising at least one matching circuit for matching an input signal to the circuit elements provided inside the semiconductor chip, the matching circuit comprising at least one inductor.

3. A hybrid IC according to claim 2, wherein a wiring pattern is formed of a single metal layer on both the front and back faces of the substrate, the wiring patterns on the respective front and back faces of the substrate being interconnected with each other via through holes, and the at least one inductor comprised in the matching circuit is formed in the wiring pattern on one of the respective front and back faces of the substrate.

4. A hybrid IC according to claim 2, wherein the matching circuit is constituted only by inductors and comprises at least one serial inductor and at least one parallel inductor.

5. A hybrid IC according to claim 4, wherein the parallel inductor comprised in the matching circuit is a spiral-type inductor, outermost wiring of the spiral-type inductor being grounded.

6. A hybrid IC according to claim 2, wherein the inductors comprised in the matching circuit are a spiral-type inductor or a meander-type inductor.

7. A hybrid IC according to claim 2, wherein the matching circuit comprises an inductor and a capacitor, the capacitor being formed inside the semiconductor chip.

8. A hybrid IC according to claim 7, wherein the inductor comprised in the matching circuit is a spiral-type inductor or a meander-type inductor.

9. A hybrid IC according to claim 1, wherein the at least one terminal includes at least an RF terminal functioning as an input terminal for an RF signal, an LO terminal functioning as an input terminal for an LO signal, an IF terminal functioning as an output terminal for an IF signal, a ground terminal, and a supply terminal.

10. A hybrid IC according to claim 9, wherein any of the at least one terminal that adjoins the RF terminal, the LO terminal, and the IF terminal is the ground terminal or the supply terminal.

11. A hybrid IC according to claim 9, wherein the semiconductor chip comprises:
    an RF amplifier for amplifying the RF signal input at the RF terminal;
    an LO amplifier for amplifying the LO signal input at the LO terminal;
    and a mixer for generating the IF signal based on the amplified RF signal and the amplified LO signal.

12. A hybrid IC according to claim 11 further comprising:
    an RF input matching circuit, connected between the RF terminal and the RF amplifier, for matching the RF signal to the RF amplifier; and
    an LO input matching circuit, connected between the LO terminal and the LO amplifier, for matching the LO signal to the LO amplifier,
    wherein each of the RF input matching circuit and the LO input matching circuit comprises at least one inductor.

13. A hybrid IC according to claim 12, wherein a wire width of the at least one inductor included in the RF input matching circuit is larger than a wire width of the at least one inductor included in the LO input matching circuit.

14. A hybrid IC according to claim 12, wherein the RF input matching circuit comprises at least one spiral-type inductor formed on one of the respective front and back faces of the substrate, a central portion of the spiral-type inductor being connected to the RF terminal via a through hole and a wire connected to the through hole and formed on the other one of the respective front and back faces of the substrate.

15. A hybrid IC according to claim 12, wherein a first LC resonance circuit or a first ¼ wavelength wire path is connected to a coupling point between the RF amplifier and the mixer and a second LC resonance circuit or a second ¼ wavelength wire path is connected to a coupling point between the LO amplifier and the mixer, the first and second LC resonance circuits or ¼ wavelength wire paths comprising a high-frequency grounding capacitor formed inside the semiconductor chip.

16. A hybrid IC according to claim 15, wherein the first LC resonance circuit or ¼ wavelength wire path connected to the coupling point between the RF amplifier and the mixer and the second LC resonance circuit or ¼ wavelength wire path connected to the coupling point between the LO amplifier and the mixer are provided on the substrate, and wherein no output matching circuit corresponding to the mixer is provided on the substrate.

17. A hybrid IC according to claim 1, wherein a grounding electrode is provided in a portion of the front face of the substrate where the semiconductor chip is mounted.

18. A hybrid IC according to claim 1, wherein a wire width of supply wiring on the substrate is equal to a minimum wire width within the substrate.

19. A hybrid IC according to claim 1, wherein the at least one terminal includes at least one supply terminal, and each one of the at least one supply terminal is connected to a plurality of inductors, a wire width of wiring for connecting the plurality of inductors being equal to a minimum wire width within the substrate.

20. A hybrid IC according to claim 1, wherein a short-circuiting conductor is provided between adjoining portions of a conductor constituting the at least one inductor on the substrate.

21. A hybrid IC according to claim 1, wherein a plurality of materials having different dielectric constants from one another are used as the highly dielectric material.

22. A hybrid IC according to claim 1, wherein the semiconductor chip is mounted on the substrate with flip-chip bonding involving an MBB (MicroBump Bonding) method or an SBB (Stud Bump Bonding) method.

23. A hybrid IC according to claim 1, wherein the semiconductor chip is affixed on the substrate by using resin.

24. A hybrid IC according to claim 1, wherein the at least one terminal has a concave shape with respect to a side face of the substrate.

25. A hybrid IC according to claim 1, wherein the at least one terminal is formed by forming a through hole in a portion of the substrate corresponding to the at least one terminal while processing the substrate and then by cutting the through hole after coating at least an inner face of the through hole with a metal film.

26. A hybrid IC according to claim 25, wherein the metal film associated with the at least one terminal has a polygonal or circular shape on the front face of the substrate.

27. A hybrid IC according to claim 1 further comprising a supply electrode and a ground electrode, each connected to the semiconductor chip, provided on the front face of the substrate, at least one of the supply electrode and the ground electrode being connected to a supply electrode and a ground electrode provided on the back face of the substrate via a plurality of through holes.

28. A hybrid IC according to claim 1, wherein at least one of the terminals is provided at one of four corners of the substrate.

29. A hybrid IC according to claim 1, wherein the substrate is composed of a material having a high dielectric constant.

30. A hybrid IC according to claim 29, wherein the substrate is a ceramic substrate.

31. A hybrid IC according to claim 1, wherein the substrate is composed of a material having a low dielectric constant.

32. A hybrid IC according to claim 31, wherein the substrate is a glass epoxy substrate.

33. A hybrid IC according to claim 1, wherein a pin electrode of a conductive material shaped so as to extend outward from the substrate is connected to each of the at least one terminal.

34. A hybrid IC according to claim 1, wherein a plurality of the MIM capacitors are provided inside the semiconductor chip, lower electrodes comprised in the plurality of MIM capacitors being interconnected to one another.

35. A hybrid IC according to claim 1, wherein the plurality of circuit elements comprised inside the semiconductor chip comprise first type circuit elements involving a signal having a large voltage and second type circuit elements involving a signal having a small voltage, the first type circuit elements being provided in an outer periphery of the semiconductor chip so as not to adjoin one another, and the second type circuit elements being provided among the first type circuit elements.

36. A hybrid IC according to claim 1, wherein the plurality of circuit elements comprised inside the semiconductor chip comprise first type circuit elements having a high characteristics impedance and second type circuit elements having a low characteristics impedance, the first type circuit elements being provided in an outer periphery of the semiconductor chip so as not to adjoin one another, and the second type circuit elements being provided among the first type circuit elements.

37. A hybrid IC according to claim 1 further comprising a resin layer having a flat upper face and covering the front face of the substrate on which the semiconductor chip is mounted, the semiconductor chip being covered by the resin layer.

* * * * *